United States Patent [19]

Shibata

[11] Patent Number: 4,914,323
[45] Date of Patent: Apr. 3, 1990

[54] BOOT-STRAP TYPE SIGNAL GENERATING CIRCUIT

[75] Inventor: Kazuo Shibata, Tokyo, Japan

[73] Assignee: NEC Corporation, Tokyo, Japan

[21] Appl. No.: 36,399

[22] Filed: Apr. 9, 1987

[30] Foreign Application Priority Data

Apr. 9, 1986 [JP] Japan .................. 61-82716

[51] Int. Cl.[4] ...................... H03K 19/01; H03K 19/94
[52] U.S. Cl. .................... 307/482; 307/269; 307/481; 307/578
[58] Field of Search ............... 307/482, 453, 578, 269, 307/448, 451, 449, 452; 365/203

[56] References Cited

U.S. PATENT DOCUMENTS 4,063,117 12/1977 Laugeseen et al. .................. 307/482
4,508,978 4/1985 Reddy .................. 307/482
4,704,706 11/1987 Nakamo et al. .................. 307/482

FOREIGN PATENT DOCUMENTS 0114439 9/1981 Japan .................. 307/482
0152119 8/1985 Japan .................. 307/482

Primary Examiner—Stanley D. Miller
Assistant Examiner—Timothy P. Callahan
Attorney, Agent, or Firm—Sughrue, Mion, Zinn, Macpeak & Seas

[57] ABSTRACT

An improved boot-strap type signal generating circuit with a small input capacitance and operable with a minimum delay time is disclosed. The signal generating circuit employs a buffer circuit responsive to an input signal for generating a buffered signal and an inverting delay circuit. The buffered signal is applied to one end of a capacitor connected to a gate of an output field effect transistor and also to an input of the inverting delay circuit. The output of the inverting delay circuit is used to control a potential of the other end of the capacitor.

5 Claims, 3 Drawing Sheets

BOOT-STRAP TYPE SIGNAL GENERATING CIRCUIT

BACKGROUND OF THE INVENTION:

The present invention relates to a boot-strap type signal generating circuit composed of field effect transistors, and more particularly to a boot-strap type signal generating circuit to be used for generating a timing signal in a dynamic memory circuit.

Boot-strap type signal generating circuits are widely utilized in MOS dynamic circuits to generating timing signals. A boot-strap type signal generating circuit is typically structured as follows. A high voltage output transistor and a low voltage output transistor are connected between a power voltage terminal and a ground voltage terminal and a boot-strap capacitor is connected between a gate of the high voltage output transistor and the intermediate junction of the high and low voltage output transistors. An input signal is applied to the gate of the high voltage output transistor via a source-drain path of a transfer gate transistor while a delayed inverted signal of the input signal (delayed inverted input signal) is applied to the gate of the low voltage output transistor. The boot-strap capacitor is charged during a delay period of the delayed inverted input signal and after the delay period the gate potential of the high voltage output transistor is raised above the power voltage at the power voltage terminal. However, according to the above conventional boot-strap type signal generating circuit, the input signal itself is applied to the gate of the high voltage output transistor and the effective capacitance at the gate of the high voltage output transistor is large. Therefore, it is difficult to drive the gate potential of the high voltage output transistor at a high speed by the input signal. This means a large input capacitance and affects the behavior of the input signal itself. Furthermore, a desired timing relation between the input signal and an output signal to be generated in accordance with the boot-strapped gate potential of the high voltage output transistor is not ensured.

SUMMARY OF THE INVENTION:

It is one object of the present invention to provide a boot-strap type signal generating circuit having a small input capacitance.

It is another object of the present invention to provide a boot-strap type signal generating circuit which can produce an output signal with a desired time relation with respect to an input signal.

The signal generating circuit according to the present invention comprises a buffer circuit responsive to an input signal for generating a buffered signal, a capacitor having a first end supplied with the buffered signal and a second end, a delay circuit for generating a delayed signal of the buffered signal, the delayed signal being applied to the second end of the capacitor, and an output field effect transistor coupled between a power voltage terminal and an output terminal and a gate connected to the first end of the capacitor.

According to the present invention, the buffer circuit applies the buffered signal of the input signal to the first end of the capacitor for charging the capacitor while the second end of the capacitor is supplied with the delayed signal of the buffered signal by the delay circuit. Therefore, a desired delay time is stably provided between the buffered signal and the delayed signal so that the capacitor is effectively charged for achieving the boot-strap effect.

Figure 1:
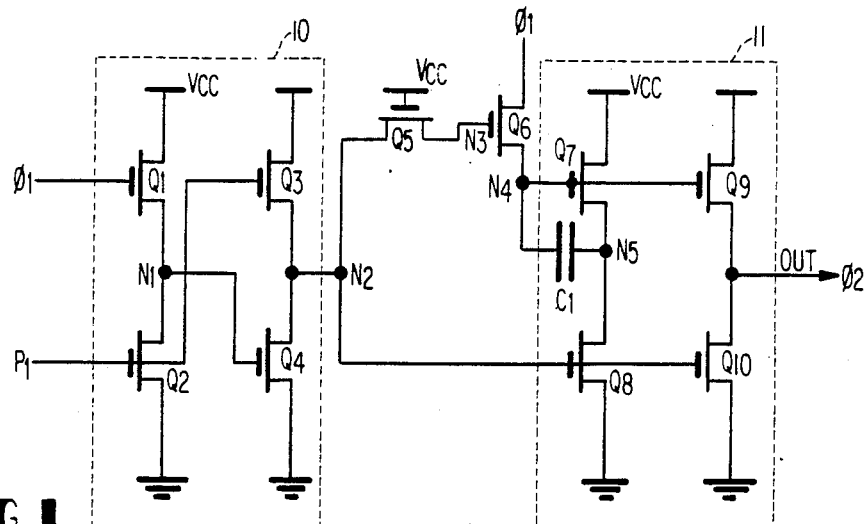
FIG. 1 is a schematic circuit diagram of a signal generating circuit according to a prior art.

DETAILED DESCRIPTION OF THE INVENTION:

FIG. 1 shows one example of a conventional signal generating circuit.

Figure 3:
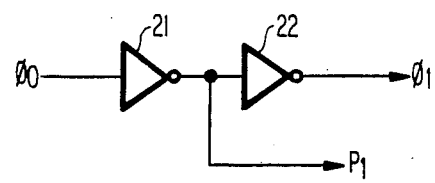
FIG. 3 is a schematic block diagram of a clock input circuit.

The signal generating circuit receives a reset input signal $P_1$ and a set input signal $\phi_1$ and generates an output signal $\phi_2$ which is slightly delayed from $\phi_1$. The signal $\phi_1$ is an inverted signal of the signal $P_1$. The signals $P_1$ and $\phi_1$ are generated, for example by inverters 21 and 22 in response to a basic input signal $\phi_0$, as shown in FIG. 3. Accordingly, the signal $\phi_1$ changes its level after the signal $P_1$ has changed its level.

An inverting delay circuit (delay inverter) 10 composed of field effect transistors $Q_1$ to $Q_4$ and generates an delayed inverted signal of the input $\phi_1$ at a node N2. An output circuit 11 includes a boot-strap stage composed of field effect transistors $Q_7$ and $Q_8$ and a boot-strap capacitor $C_1$ and an output stage composed of field effect transistors $Q_9$ and $Q_{10}$. Field effect transistors $Q_5$ and $Q_6$ form a boot control circuit.

Figure 2:
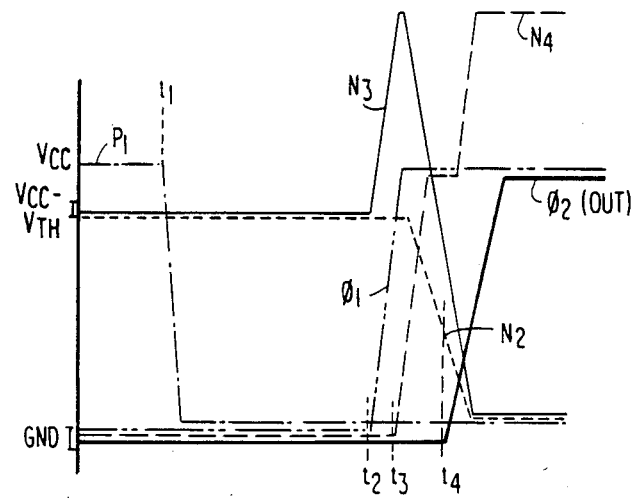
FIG. 2 is a timing diagram showing waveforms at major parts of the circuit of FIG. 1.

FIG. 2 shows an operation of the circuit of FIG. 1.

Prior to a time $t_1$, the signal $P_1$ assumes a high level (a power voltage $V_{CC}$) while the signal $\phi_1$ assumes a low level (ground level) and the generating circuit takes a reset state. In the reset state, the transistors $Q_2$ and $Q_3$ are conducting and a potential at the N2 is at the level $[V_{CC}-V_{TH}]$, $V_{TH}$ being a threshold voltage of the transistor $Q_3$. Thus, the gate of the transistor $Q_6$ is set at the level $[V_{CC}-V_{TH}]$ and a node N4 and an output OUT are set at the ground potential because the transistors $Q_8$ and $Q_{10}$ are conducting.

At the time $t_1$, the signal $P_1$ falls and thereafter the signal $\phi_1$ rises in level so that the potential at the gate N3 is raised above $V_{CC}$ by a self-boot effect through a stray capacitance between the gate and the source of the transistor $Q_6$ and the potential at the node N4 is raised from the ground level to $V_{CC}$ at a time $t_3$, while the potential at the node N2 still remains at a high level during a delay period of the circuit 10 at least until $t_3$ and the transistors $Q_8$ and $Q_{10}$ are still conductive. Thus, the capacitor $C_2$ is charged approximately to $V_{CC}$. At a time $t_4$, the potential at the node N2 becomes lower than a threshold voltage of the transistors $Q_8$ and $Q_{10}$ and the transistors $Q_8$ and $Q_{10}$ become non-conducting to allow the potential at the node N5 to rise. Thus, the potential at the node N4 rises above $V_{CC}$ to produce the output signal $\phi_2$ of $V_{CC}$.

Since the input signal $\phi_1$ is applied to the gate N4 of the transistor $Q_7$ via a DC path of the transistor $Q_6$ and a large capacitance due to the capacitor $C_1$ is associated with the node N4, the input signal $\phi_1$ itself is forced to drive the node N4 having a large effective capacitance. Therefore, the signal $\phi_1$ has to be generated by a large inverter having a large drivability. Otherwise, driving of the node N4 inevitably becomes slow.

Figure 4:
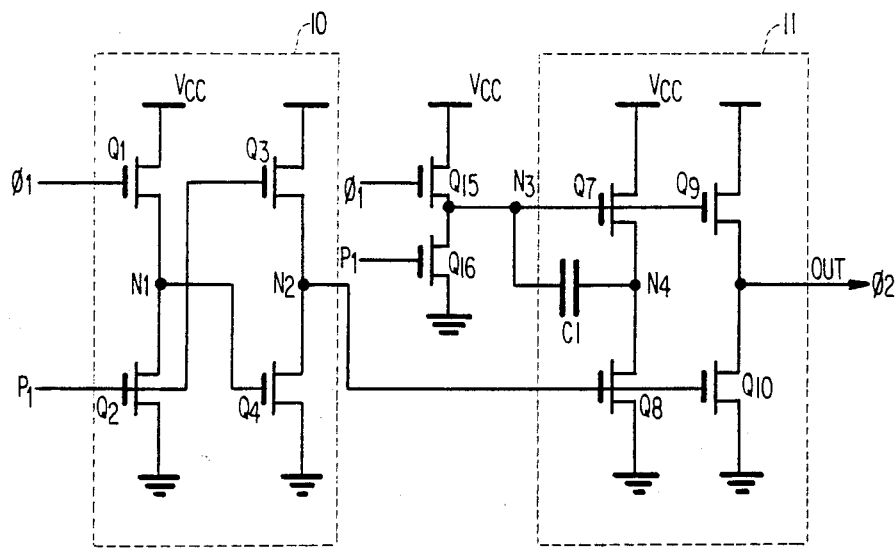
FIG. 4 is a schematic circuit diagram of an improved signal generating circuit.

In order to obviate the above defect in the circuit of FIG. 1, a signal generating circuit of FIG. 4 might be conceived.

This circuit is obtained by employing a buffer circuit composed of field effect transistors $Q_{15}$ and $Q_{16}$ in place of the control circuit of $Q_5$ and $Q_6$ in FIG. 1. The buffer circuit ($Q_{15}$, $Q_{16}$) produces an output signal which is slightly delayed with respect to the signal $\phi_1$.

Figure 5:
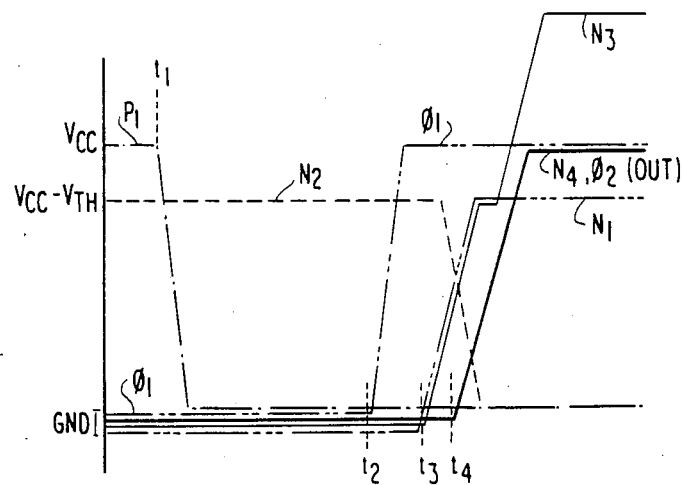
FIG. 5 is a timing diagram showing an operation of the circuit of FIG. 4.

FIG. 5 shows an operation of the circuit of FIG. 4.

During a reset state in which the signal $P_1$ is at $V_{CC}$ and the signal $\phi_1$ is at the ground level, the nodes N1, N3 and N4 are set at the ground level because the transistors $Q_2$, $Q_3$, $Q_{16}$, $Q_8$ and $Q_{10}$ are conducting, prior to a time $t_1$. Then, the signal $\phi_1$ starts to rise at a time $t_2$ and the potentials at the nodes N1 and N3 also start to rise at a time $t_3$ which is slightly later the time $t_2$. Then, in response to the rise of the potential at the node N1, the potential at the node N2 starts to fall. At a time $t_4$, the potential at the node N2 becomes lower than the threshold voltage of the transistor $Q_8$ and the potential at the node N4 starts to rise. In response to the rise of the potential at the node N4, the potential at the node N3 is raised above $V_{CC}$ to make the transistors $Q_7$ and $Q_9$ in the nonsaturated region, because the capacitor $C_1$ is already charged during the period from $t_3$ to $t_4$. Thus, the output signal $\phi_2$ of $V_{CC}$ is generated. However, in the circuit of FIG. 4, a relatively small delay time is produced from the rise of the potential at the node N3 to the rise of the potential at the node N4 and this small delay is easily affected by parameters of the transistors. Accordingly, it is difficult to charge the capacitor $C_1$ stably prior to the rise of the potential at the node N4. In the event that the capacitor $C_1$ is not charged enough, it cannot be expected to produce the $V_{CC}$ level of $\phi_2$.

Figure 6:
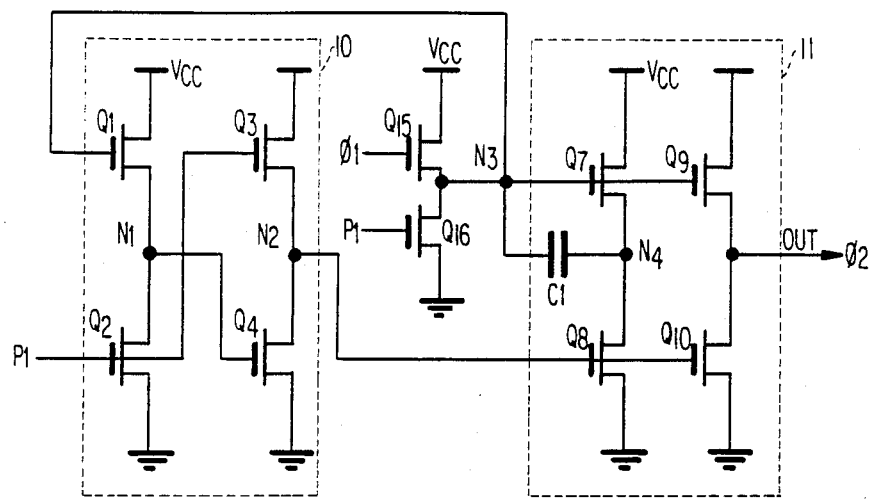
FIG. 6 is a schematic circuit diagram showing a signal generating circuit according to one embodiment of the present invention.

FIG. 6 shows an embodiment of the present invention.

This embodiment is achieved by connecting the output (N3) of the buffer composed of the transistors $Q_{15}$ and $Q_{16}$ to the gate of the transistor $Q_1$ in the delay circuit 10.

Since the potential at the node N3 is a delayed signal of the input signal $\phi_1$, and the delay circuit 10 receives this delayed signal as an input signal, the potential at the node N2 is provided with a large delay time with respect to the input signal $\phi_1$. A sufficiently large delay time can be provided for the rise of the potential at the node N4 from the rise of the potential at the node N3. Thus, it is ensured to charge the capacitor stably.

Figure 7:
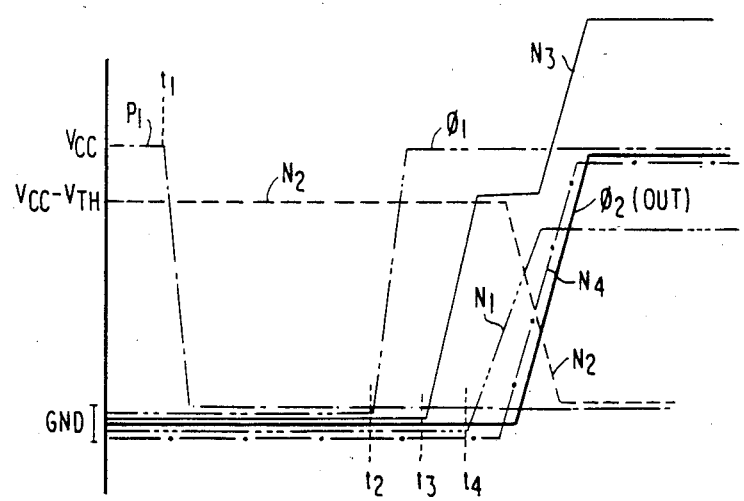
FIG. 7 is a timing diagram showing an operation of the circuit of FIG. 6.

FIG. 7 shows an operation of the circuit of FIG. 6.

In a reset state prior to $t_1$, the signal $P_1$ is at the $V_{CC}$ level whereas the input signal $\phi_1$ is at the ground level so that nodes N1, N3 and N4 are at the ground level whereas a node N2 is at the $[V_{CC}-V_{TH}]$ level.

After the signal $P_1$ falls and the input signal $\phi_1$ then rises at $t_2$, the level at the node N3 is raised from the ground level towards $V_{CC}$ at $t_3$. Simultaneously with this, the transistor $Q_1$ is turned "ON" so that the level at the node N1 starts to rise from the ground level to $V_{CC}$ at $t_4$. Then, the transistor $Q_4$ is turned "ON" so that the level at the node N2 starts to fall. Since a time delay is introduced by making a feedback from the node N3 to turn "ON" the transistor $Q_1$ thereby to lower the level at the node N2, the level at the node N3 is already raised to turn "ON" the transistors $Q_7$ and $Q_1$ before the level at the node N2 is dropped to turn "OFF" transistors $Q_8$ and $Q_{10}$. When the level at the node N2 is dropped to turn "OFF" $Q_8$, the level at the node N4, which has been suppressed to the ground level by the size ratio of the transistors $Q_7$ and $Q_8$, is raised so that the level at the node N3 is raised above $V_{CC}$ by the boot effect by the capacitor $C_1$. As a result, an output signal at the supply level is outputted.

Thus, the node N3 provides a start signal for the delay circuit 10 so that the control of the delay time can be conducted easily and accurately.

As has been described hereinbefore, the present invention can provided effects that an output signal having a high driving ability can be extracted by inputting the activation signal to one gate even if the activation signal has a low driving ability, and that a synchronization of the output signal of the inverter circuit with the output signal of the delay unit can be easily made by feeding back the output signal of the inverter circuit.

I claim:

1. A boot-strap type signal generating circuit comprising means for receiving a first input signal, means for receiving a second input signal complementary to said first input signal, a first field effect transistor coupled between a power voltage terminal and a first node and having a gate supplied with said first input signal, a second field effect transistor coupled between said first node and a reference voltage terminal and having a gate supplied with said second input signal, a third field effect transistor coupled between said power voltage terminal and a second node and having a gate coupled to said first node, a fourth field effect transistor coupled between said second node and said reference voltage terminal and having a gate supplied with said second input signal, a fifth field effect transistor coupled between said power voltage terminal and a third node and having a gate supplied with said second input signal, a sixth field effect transistor coupled between said third node and said reference voltage terminal and having a gate coupled to said second node, a seventh field effect transistor coupled between said power voltage terminal and a fourth node and having a gate coupled to said first node, an eighth field effect transistor coupled between said fourth node and said reference voltage terminal and having a gate coupled to said third node, a capacitor coupled between said first node and said fourth node, a ninth field effect transistor coupled between said power voltage terminal and an output terminal and having a gate connected to said first node, and a tenth field effect transistor coupled between said output terminal and said reference voltage terminal and having a gate connected to said third node.

2. A boot-strap type signal generating circuit comprising means for receiving an input signal, a buffer circuit having an input node supplied with said input signal and an output node for generating a buffered signal of substantially the same phase as said input signal, a delay circuit having an input node coupled to said output node of said buffer circuit to receive said buffered signal and an output node for generating an inverted delayed signal of the opposite phase to said buffered signal with delay, said inverted delay signal assuming an inactive level after a predetermined time lapse from the time when said buffered signal is changed from the inactive level to the active level, a first field effect transistor having a source-drain path coupled between a power voltage terminal and a first node and a gate supplied with said buffered signal, a capacitor coupled between the gate of said first transistor and said first node, a second field effect transistor having a source-drain path coupled between said first node and a reference voltage terminal and a gate supplied with said inverted delay signal, a third field effect transistor having a source-drain path coupled between said power voltage terminal and an output terminal and a gate connected to the gate of said first transistor, and a fourth field effect transistor having a source-drain path connected between said output terminal and said reference voltage terminal and a gate supplied with said inverted delay signal.

3. The circuit according to claim 2, in which said buffer circuit includes a fifth field effect transistor having a source-drain path coupled between said power voltage terminal and said output node of said buffer circuit and a gate connected to said input node of said buffer circuit and a sixth field effect transistor having a source-drain path coupled between said output node of said buffer circuit and said reference voltage terminal and a gate receiving an inverted input signal substantially of the opposite phrase to said input signal.

4. The circuit according to claim 2, in which said delay circuit includes a fifth field effect transistor having a source-drain path coupled between said power voltage terminal and a second node and a gate supplied with said buffered signal, a sixth field effect transistor having a source-drain path coupled between said second node and said reference voltage terminal and a gate supplied with an inverted signal of said input signal, a seventh field effect transistor having a source-drain path coupled between said power voltage terminal and said output node of said circuit and a gate supplied with said inverted delay signal, and an eighth field effect transistor having a source-drain path coupled between said output node of said delay circuit and said reference voltage terminal and a gate connected to said second node.

5. A boot-strap type signal generating circuit comprising means for receiving a first input signal, means for receiving a second input signal complementary to said first input signal, a first field effect transistor coupled between a power voltage terminal and a first node and having a gate supplied with said first input signal, a second field effect transistor coupled between said first node and a reference voltage terminal and having a gate supplied with said second input signal, a third field effect transistor coupled between said power voltage terminal and a second node and having a gate coupled to said first node, a fourth field effect transistor coupled between said second node and said reference voltage terminal and having a gate supplied with said second input signal, a fifth field effect transistor coupled between said power voltage terminal and a third node and having a gate supplied with said second input signal, a sixth field effect transistor coupled between said third node and said reference voltage terminal and having a gate coupled to said second node, a seventh field effect transistor coupled between said power voltage terminal and a fourth node and having a gate coupled to said first node, an eight field effect transistor coupled between said fourth node and said reference voltage terminal and having a gate coupled to said third node, and a capacitor coupled between said first node and said fourth node, whereby the potential at the gate of said seventh transistor is capacitively boosted up above the potential of said power voltage terminal through said capacitor.

* * * * *